US012593430B2

(12) United States Patent
    Fukagawa

(10) Patent No.: US 12,593,430 B2
(45) Date of Patent: Mar. 31, 2026

(54) ELECTROMAGNETIC WAVE SHIELDING MATERIAL, ELECTRONIC COMPONENT, AND ELECTRONIC APPARATUS

(71) Applicant: FUJIFILM Corporation, Tokyo (JP)

(72) Inventor: Kiyotaka Fukagawa, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 39 days.

(21) Appl. No.: 18/647,112

(22) Filed: Apr. 26, 2024

(65) Prior Publication Data

US 2024/0276692 A1     Aug. 15, 2024

Related U.S. Application Data

(63) Continuation of application No. PCT/JP2022/039511, filed on Oct. 24, 2022.

(30) Foreign Application Priority Data

Oct. 29, 2021     (JP) ................................. 2021-178044

(51) Int. Cl.
    *H05K 9/00*        (2006.01)
    *H01F 1/28*        (2006.01)
(52) U.S. Cl.
    CPC ............. *H05K 9/0088* (2013.01); *H01F 1/28* (2013.01); *H05K 9/0084* (2013.01)
(58) Field of Classification Search
    CPC .................................................. H05K 9/0083
    See application file for complete search history.

(56) References Cited

U.S. PATENT DOCUMENTS

| 2005/0077785 A1* | 4/2005 | Yoshida ............... H05K 9/0083 307/91 |
| 2010/0139971 A1* | 6/2010 | Kato .................... H05K 9/0083 174/388 |
| 2020/0267877 A1 | 8/2020 | Hiroi et al. | |

FOREIGN PATENT DOCUMENTS

| JP | 2019-153623 A | 9/2019 |
| WO | 2018/084235 A1 | 5/2018 |

OTHER PUBLICATIONS

International Search Report dated Jan. 24, 2023, issued in International Application No. PCT/JP2022/039511.
Written Opinion dated Jan. 24, 2023, issued in International Application No. PCT/JP2022/039511.
International Preliminary Report on Patentability (with translation of Written Opinion) dated Apr. 30, 2024, issued in International Application No. PCT/JP2022/039511.

* cited by examiner

*Primary Examiner* — Hung V Ngo
(74) *Attorney, Agent, or Firm* — Sughrue Mion, PLLC

(57)     ABSTRACT

There are provided an electromagnetic wave shielding material including one or more magnetic layers containing magnetic particles and a resin, where a content of the resin in the magnetic layer is 5% by mass or more and less than 40% by mass; and one or more pressure-sensitive adhesive layers, in which an elongation rate determined by a tensile test at 150° C. is 5.0% or more and less than 150.0%, as well as an electronic component and an electronic apparatus which include the electromagnetic wave shielding material.

19 Claims, No Drawings

ELECTROMAGNETIC WAVE SHIELDING MATERIAL, ELECTRONIC COMPONENT, AND ELECTRONIC APPARATUS

CROSS-REFERENCE TO RELATED APPLICATIONS

This application is a Continuation of PCT International Application No. PCT/JP2022/039511 filed on Oct. 24, 2022, which claims priority under 35 U.S.C. § 119(a) to Japanese Patent Application No. 2021-178044 filed on Oct. 29, 2021. Each of the above applications is hereby expressly incorporated by reference, in its entirety, into the present application.

BACKGROUND OF THE INVENTION

1. Field of the Invention

The present invention relates to an electromagnetic wave shielding material, an electronic component, and an electronic apparatus.

2. Description of the Related Art

An electromagnetic wave shielding material has attracted attention as a material for reducing the influence of an electromagnetic wave in various electronic components and various electronic apparatuses (see, for example, JP2019-153623A).

SUMMARY OF THE INVENTION

An electromagnetic wave shielding material (hereinafter, also described as a "shielding material") is capable of exhibiting the performance of shielding electromagnetic waves (shielding ability) by reflecting electromagnetic waves incident on the shielding material by the shielding material and/or by attenuating the electromagnetic waves in the inside the shielding material.

The following two performances can be mentioned as the performance desired for the electromagnetic wave shielding material.

The first is that a high shielding ability can be exhibited against electromagnetic waves. An electromagnetic wave shielding material that exhibits a high shielding ability against electromagnetic waves is desirable since it can contribute to significantly reducing the influence of electromagnetic waves on an electronic component and an electronic apparatus.

The second is that formability is excellent. The electromagnetic wave shielding material can be processed into various shapes in order to be incorporated into an electronic component or an electronic apparatus. Excellent formability can refer to that defects such as a shape defect and breakage are less likely to occur in forming. An electromagnetic wave shielding material having excellent formability is desirable, from the viewpoint that, for example, a formed article is less likely to be broken in three-dimensional forming (in other words, forming in a three-dimensional manner). It is noted that JP2019-153623A does not describe such formability as described above.

In consideration of the above circumstances, an object of one aspect of the present invention is to provide an electromagnetic wave shielding material that is capable of exhibiting a high shielding ability against electromagnetic waves and is excellent in formability.

An aspect of the present invention is as follows.

[1] An electromagnetic wave shielding material comprising:

one or more magnetic layers containing magnetic particles and a resin, where a content of the resin in the magnetic layer is 5% by mass or more and less than 40% by mass; and one or more pressure-sensitive adhesive layers, in which an elongation rate determined by a tensile test at 150° C. (hereinafter, also described as "a 150° C.-tensile test elongation rate") is 5.0% or more and less than 150.0%.

[2] The electromagnetic wave shielding material according to [1], in which a storage elastic modulus E' in a dynamic viscoelasticity measurement at 1 Hz is 0.010 gigapascals (GPa) or more and less than 10.000 GPa at 60° C. Hereinafter, the storage elastic modulus E' will also be described as "E' at 60° C.".

[3] The electromagnetic wave shielding material according to [1] or [2], in which the magnetic layer contains a resin having a urethane structure.

[4] The electromagnetic wave shielding material according to any one of [3] to [1], further comprising:

a resin layer that is located between two layers of the pressure-sensitive adhesive layers.

[5] The electromagnetic wave shielding material according to [4], in which a thickness of the resin layer is less than 10 μm.

[6] The electromagnetic wave shielding material according to any one of [1] to [5], further comprising:

two or more metal layers, in which the electromagnetic wave shielding material includes one or more layers of the magnetic layers, the one or more layers being sandwiched between two layers of the metal layer.

[7] The electromagnetic wave shielding material according to any one of [1] to [6], in which the magnetic layer contains flat-shaped metal particles as the magnetic particles.

[8] The electromagnetic wave shielding material according to any one of [1] to [7], in which the electromagnetic wave shielding material has a sheet shape.

[9] An electronic component comprising:

the electromagnetic wave shielding material according to any one of [1] to [8].

[10] An electronic apparatus comprising:

the electromagnetic wave shielding material according to any one of [1] to [8].

According to one aspect of the present invention, it is possible to provide an electromagnetic wave shielding material that is capable of exhibiting a high shielding ability against electromagnetic waves and is excellent in formability. In addition, according to one aspect of the present invention, it is possible to provide an electronic component and an electronic apparatus, which include the electromagnetic wave shielding material.

DESCRIPTION OF THE PREFERRED EMBODIMENTS

[Electromagnetic Wave Shielding Material]

One aspect of the present invention relates to an electromagnetic wave shielding material including one or more magnetic layers containing magnetic particles and a resin, where a content of the resin in the magnetic layer is 5% by mass or more and less than 40% by mass; and one or more pressure-sensitive adhesive layers, in which an elongation rate determined by a tensile test at 150° C. (a 150° C.-tensile test elongation rate) is 5.0% or more and less than 150.0%.

In the present invention and the present specification, the "electromagnetic wave shielding material" shall refer to a material that is capable of exhibiting shielding ability against an electromagnetic wave of at least one frequency or at least a part of a range of a frequency band. The "electromagnetic wave" includes a magnetic field wave and an electric field wave. The "electromagnetic wave shielding material" is preferably a material that is capable of exhibiting shielding ability against one or both of a magnetic field wave of at least one frequency or at least a part of a range of a frequency band and an electric field wave of at least one frequency or at least a part of a range of a frequency band.

In the present invention and the present specification, "magnetic" means having a ferromagnetic property. Details of the magnetic layer will be described later.

<150° C.-Tensile Test Elongation Rate>

The elongation rate (150° C.-tensile test elongation rate) of the electromagnetic wave shielding material, which is determined by a tensile test at 150° C., is 5.0% or more and less than 150.0%.

Regarding the formability of the electromagnetic wave shielding material, the forming method for three-dimensional forming can be roughly classified into hot forming and cold forming, and a heated forming target is formed in hot forming. Examples of such three-dimensional forming methods include air pressure forming method and a vacuum forming method. The air pressure forming method is a forming method in which in a state of being heated and softened, a sheet-shaped forming target is closely attached to a forming die with compressed air to form the forming target into a three-dimensional shape. The vacuum forming method is a forming method in which in a state where a sheet-shaped forming target is heated and softened, a space between the forming target and the forming die is made into a vacuum state, whereby the forming target is closely attached to the forming die to be formed into a three-dimensional shape.

The inventors of the present invention carried out intensive studies in order to obtain an electromagnetic wave shielding material that exhibits excellent formability in a forming method for three-dimensionally forming a forming target heated as described above. As a result, the inventors of the present invention newly found that in an electromagnetic wave shielding material in which the elongation rate determined by a tensile test at 150° C. (the 150° C.-tensile test elongation rate) is in the range described above, a formed article obtained by a three-dimensional forming in such a forming method is less likely to broken. It is noted that the temperature of 150° C. adopted as a temperature of the tensile test is adopted as an example of the temperature of a forming target heated for forming, where the heating temperature in a case of forming the electromagnetic wave shielding material is not limited to such a temperature.

In the present invention and the present specification, the tensile test at 150° C. is carried out according to the following method.

A measurement sheet having a length of 50 mm and a width of 10 mm is cut out from an electromagnetic wave shielding material to be measured. This measurement sheet is attached to a tensile tester, and a tensile test is carried out under the following measurement conditions. In order to adapt the measurement sheet to the measurement environment, the measurement sheet is placed in the measurement environment for 15 minutes or more and then attached to the tensile tester to carry out the tensile test. The 150° C.-tensile test elongation rate is determined as 150° C.-tensile test elongation rate [unit: %]=100×L/distance between chucks, where L is the longest elongation of the test sheet elongated in the tensile test (that is, an elongation displacement in a length direction at a time point at which at least one layer is broken in the measurement sheet). The fact that at least one layer is broken can be determined by a decrease in stress in a stress-strain curve, visual observation, or the like. As the tensile tester, for example, an autograph (AGX-5kNVD) manufactured by Shimadzu Corporation can be used, and this tensile tester was used in Examples described below.

(Measurement Conditions)

Distance between chucks: 25 mm

Measurement environment: temperature of 150° C.

Load cell: 500 newtons (N)

Tensile rate: 1 mm/min

Tensile direction: length direction

From the viewpoint of improving formability, the 150° C.-tensile test elongation rate of the electromagnetic wave shielding material is 5.0% or more, preferably 10.0% or more, more preferably 15.0% or more, and still more preferably 20.0% or more, 25.0% or more, and 30.0% or more in this order. In addition, in the electromagnetic wave shielding material having a large value of the 150° C.-tensile test elongation rate, the content of the resin of the magnetic layer tends to be high, and the magnetic permeability of the magnetic layer tends to decrease since the content of the magnetic particles in the magnetic layer may be relatively low. In comprehensive consideration of the above points, the 150° C.-tensile test elongation rate of the electromagnetic wave shielding material is preferably less than 150.0%, and more preferably less than 100.0% and less than 50.0% in this order.

The 150° C.-tensile test elongation rate can be controlled by a kind of a layer constituting the electromagnetic wave shielding material, a kind and a content of the resin contained in the magnetic layer, or the like. This point will be described below in detail.

Hereinafter, the electromagnetic wave shielding material will be described in more detail.

<Magnetic Layer>

(Resin)

The electromagnetic wave shielding material has one or more magnetic layers that contain magnetic particles and a resin. The resin can act as a binder in the magnetic layer. In the present invention and the present specification, a layer containing both magnetic particles and a resin shall correspond to the "magnetic layer". The content of the resin of the magnetic layer is 5% by mass or more with respect to the total mass of the magnetic layer, and it is preferably 10% by mass or more, and more preferably 15% by mass or more. The higher the content of the resin in the magnetic layer is, the easier it is to manufacture an electromagnetic wave shielding material having a desired shape such as a sheet shape, and further, the value of the 150° C.-tensile test elongation rate tends to increase. In addition, the content of the resin of the magnetic layer is less than 40% by mass with respect to the total mass of the magnetic layer, and it is preferably 35% by mass or less, more preferably 30% by mass or less, and still more preferably 25% by mass or less. From the viewpoint of increasing the magnetic permeability of the magnetic layer, the lower the content of the resin in the magnetic layer is, the more preferable it is. The contents of various components in the magnetic layer can be determined by a well-known method such as thermogravimetry/differential thermal analysis (TG/DTA) or extraction of various components using a solvent. It is noted that "TG/

DTA" is generally called thermal gravity-differential thermal analysis. In a case where a composition of a composition for forming a magnetic layer, which has been used for forming the magnetic layer, is known, the contents of various components in the magnetic layer can be also determined from this known composition.

In the present invention and the present specification, the "resin" means a polymer, and it shall include rubber and an elastomer as well. The polymer includes a homopolymer and a copolymer. The rubber includes natural rubber and synthetic rubber. The elastomer is a polymer that exhibits elastic deformation. Examples of the resin to be contained in the magnetic layer include known thermoplastic resins in the related art, a thermosetting resin, an ultraviolet curable resin, a radiation curable resin, a rubber-based material, and an elastomer. Specific examples thereof include a polyester resin, a polyethylene resin, a polyvinyl chloride resin, a polyvinyl butyral resin, a polyurethane resin, a polyester urethane resin, a cellulose resin, an acrylonitrile-butadiene-styrene (ABS) resin, a nitrile-butadiene rubber, a styrene-butadiene rubber, an epoxy resin, a phenol resin, an amide resin, a silicone resin, a styrene-based elastomer, an olefin-based elastomer, a vinyl chloride-based elastomer, a polyester-based elastomer, a polyamide-based elastomer, a polyurethane-based elastomer, and an acrylic elastomer. Among them, a resin having a urethane structure, such as a polyurethane resin, a polyester urethane resin, or a polyurethane-based elastomer, is preferable from the viewpoint of further improving the formability. In the present invention and the present specification, "the resin having a urethane structure" refers to a resin having a structure that includes one or more urethane bonds ($-NH-C(=O)O-$). It is noted that the kind of the resin contained in the magnetic layer can be determined by, for example, organic analysis such as thermal decomposition gas chromatography/mass spectrometry (GC/MS) or Fourier transform infrared spectroscopy. For example, in a case where an isocyanate component residue and/or a polyol component residue has been observed in thermal decomposition GC/MS, it can be determined that the resin has a urethane structure.

The glass transition temperature Tg of the resin contained in the magnetic layer is preferably 50° C. or lower, more preferably 45° C. or lower, and still more preferably 40° C. or lower, 35° C. or lower, 30° C. or lower, 25° C. or lower, less than 25° C., 20° C. or lower, 15° C. or lower, 10° C. or lower, 5° C. or lower, 0° C. or lower, −5° C. or lower, and −10° C. or lower in this order. A case where the glass transition temperature Tg of the resin contained in the magnetic layer is in the above-described range is preferable for controlling the 150° C.-tensile test elongation rate within the above-described range. In addition, the glass transition temperature Tg of the resin to be contained in the magnetic layer can be, for example, −50° C. or higher, −40° C. or higher, or −30° C. or higher. In the present invention and the present specification, the glass transition temperature Tg of the resin is a value that is determined as the baseline shift start temperature of a heat flow chart at the time of temperature rise from the measurement result of the heat flow measurement using a differential scanning calorimeter.

(Magnetic Particle)

Examples of the magnetic particles contained in the magnetic layer of the electromagnetic wave shielding material include one kind selected from the group consisting of magnetic particles generally called soft magnetic particles, such as metal particles and ferrite particles, or a combination of two or more kinds thereof. Since the metal particles generally have a saturation magnetic flux density of about 2 to 3 times as compared with ferrite particles, the metal particles can maintain specific magnetic permeability and exhibit shielding ability even under a strong magnetic field without magnetic saturation. Therefore, the magnetic particles to be contained in the magnetic layer are preferably metal particles. In the present invention and the present specification, a layer containing metal particles as the magnetic particles shall correspond to the "magnetic layer".

Metal Particle

Examples of the metal particles as the magnetic particles include particles of Sendust (an Fe—Si—Al alloy), a permalloy (an Fe—Ni alloy), a molybdenum permalloy (an Fe—Ni—Mo alloy), a Fe—Si alloy, a Fe—Cr alloy, an Fe-containing alloy generally called the iron-based amorphous alloy, a Co-containing alloys generally called the cobalt-based amorphous alloy, an alloy generally called the nanocrystal alloy, iron, Permendur (an Fe—Co alloy). Among them, Sendust is preferable since it exhibits a high saturation magnetic flux density and a high specific magnetic permeability. The metal particle may contain, in addition to the constitutional element of the metal (including the alloy), elements contained in an additive that can be optionally added and/or elements contained in impurities that can be unintentionally mixed in a manufacturing process of the metal particle at any content. In the metal particle, the content of the constitutional element of the metal (including the alloy) is preferably 90.0% by mass or more and more preferably 95.0% by mass or more, and it may be 100% by mass or may be less than 100% by mass, 99.9% by mass or less, or 99.0% by mass or less.

In one form, the shielding ability of the electromagnetic wave shielding material against the electromagnetic wave can be evaluated using, as an indicator, the magnetic permeability (specifically, the real part of the complex specific magnetic permeability) of the magnetic layer included in the electromagnetic wave shielding material. The magnetic permeability (specifically, the real part of the complex specific magnetic permeability) having a magnetic layer that exhibits a high magnetic permeability (specifically, the real part of the complex specific magnetic permeability) is preferable since it can exhibit a high shielding ability against electromagnetic waves.

In a case where a complex specific magnetic permeability is measured by a magnetic permeability measuring apparatus, a real part u' and an imaginary part u' are generally displayed. In the present invention and the present specification, a real part of a complex specific magnetic permeability shall refer to such a real part u'. Hereinafter, a real part of a complex specific magnetic permeability at a frequency of 3 megahertz (MHz) is also simply referred to as "magnetic permeability". The magnetic permeability can be measured by a commercially available magnetic permeability measuring apparatus or a magnetic permeability measuring apparatus having a known configuration. From the viewpoint that still more excellent electromagnetic wave shielding ability can be exhibited, the magnetic permeability (the real part of complex specific magnetic permeability at a frequency of 3 MHZ) of the magnetic layer included in the electromagnetic wave shielding material is preferably 40 or more, more preferably 100 or more, and still more preferably 120 or more. In addition, the magnetic permeability can be, for example, 500 or less, 300 or less, or 200 or less, and it can exceed the values exemplified here. The electromagnetic wave shielding material having a high magnetic permeability is preferable since it can exhibit an excellent electromagnetic wave shielding ability.

From the viewpoint of forming a magnetic layer that exhibits a high magnetic permeability, the above-described magnetic particles are preferably particles having a flat shape (flat-shaped particles), and more preferably metal particles having a flat shape. In a case of arranging the long side direction of the flat-shaped particles to be closer to a state parallel to the in-plane direction of the magnetic layer, the magnetic layer can exhibit a higher magnetic permeability since the diamagnetic field can be reduced by aligning the long side direction of the particle with the vibration direction of the electromagnetic wave incident orthogonal to the electromagnetic wave shielding material. In the present invention and the present specification, the "flat-shaped particle" refers to a particle having an aspect ratio of 0.20 or less. The aspect ratio of the flat-shaped particles is preferably 0.15 or less, and more preferably 0.10 or less. The aspect ratio of the flat-shaped particles can be, for example, 0.01 or more, 0.02 or more, or 0.03 or more. It is possible to make the shape of the particle flat-shaped, for example, by carrying out the flattening process according to a known method. For the flattening process, for example, the description of JP2018-131640A can be referenced, specifically, the description of paragraphs 0016 and 0017 and the description of Examples of the same publication can be referenced. Examples of the magnetic layer that exhibits a high magnetic permeability include a magnetic layer containing flat-shaped particles of Sendust.

As described above, from the viewpoint of forming a layer that exhibits a high magnetic permeability as the magnetic layer, it is preferable to arrange the long side direction of the flat-shaped particles to be closer to a state parallel to the in-plane direction of the magnetic layer. From this point, the alignment degree which is a sum of an absolute value of the average value of alignment angles of the flat-shaped particles with respect to the surface of the magnetic layer and a variance of the alignment angles is preferably 30° or lower, more preferably 25° or lower, still more preferably 20° or lower, and even still more preferably 15° or lower. The alignment degree can be, for example, 3° or higher, 5° or higher, or 10° or higher, and it can be lower than the values exemplified here. A method of controlling the alignment degree will be described later.

In the present invention and the present specification, the aspect ratio of the magnetic particle and the alignment degree are determined according to the following methods.

A cross section of a magnetic layer is exposed according to a known method. In a randomly selected region of this cross section, a cross-sectional image is acquired as a scanning electron microscope (SEM) image. The imaging conditions are set to be an acceleration voltage of 2 kV and a magnification of 1,000 times, and an SEM image is obtained as the backscattered electron image.

Reading is carried out in grayscale with the cv2. imread( ) function of Image processing library OpenCV 4 (manufactured by Intel Corporation) by setting the second argument to 0, and a binarized image is obtained with the cv2. threshold ( ) function, using an intermediate brightness between the high-brightness portion and the low-brightness portion as a boundary. A white portion (high-brightness portion) in the binarized image is defined as a magnetic particle.

Regarding the obtained binarized image, a rotational circumscribed rectangular shape corresponding to a portion of each magnetic particle is determined according to the cv2. minAreaRect ( ) function, and the long side length, the short side length, and the rotation angle are determined as the return values of the cv2. minAreaRect ( ) function. In a case of determining the total number of magnetic particles included in the binarized image, it shall be assumed that particles in which only a part of the particle is included in the binarized image are also included. Regarding the particles in which only a part of the particle is included in the binarized image, the long side length, the short side length, and the rotation angle of the portion included in the binarized image are determined. The ratio of the short side length to the long side length (short side length/long side length) determined in this way shall be denoted as the aspect ratio of each magnetic particle. In the present invention and the present specification, in a case where the number of magnetic particles which have an aspect ratio of 0.20 or less and is defined as flat-shaped particles is 10% or more on a number basis with respect to the total number of magnetic particles included in the binarized image, it shall be determined that the magnetic layer is a "magnetic layer including flat-shaped particles as the magnetic particles". In addition, from the rotation angle determined as above, an "alignment angle" is determined as a rotation angle with respect to a horizontal plane (the surface of the magnetic layer).

Particles having an aspect ratio of 0.20 or less, which are determined in the binarized image, are defined as flat-shaped particles. Regarding the alignment angles of all the flat-shaped particles included in the binarized image, the sum of the absolute value of the average value (arithmetic average) and the variance is determined. The sum determined in this way is referred to as the "alignment degree". It is noted that the coordinates of the circumscribed rectangle are calculated using the cv2. boxPoints ( ) function, and an image in which the rotational circumscribed rectangle is superposed on the original image is created according to the cv2. drawContours ( ) function, where a rotational circumscribed rectangle that is erroneously detected clearly is excluded from the calculation of the aspect ratio and the alignment degree. In addition, an average value (arithmetic average) of the aspect ratios of the particles defined as the flat-shaped particles shall be denoted as the aspect ratio of the flat-shaped particles to be contained in a magnetic layer to be measured. Such an aspect ratio is 0.20 or less, preferably 0.15 or less, and more preferably 0.10 or less. In addition, the aspect ratio can be, for example, 0.01 or more, 0.02 or more, or 0.03 or more.

The content of the magnetic particles in the magnetic layer is, for example, 50% by mass or more, 60% by mass or more, 70% by mass or more, and 80% by mass or more with respect to the total mass of the magnetic layer, and it can be, for example, 100% by mass or less, 98% by mass or less, or 95% by mass or less.

In one form, the magnetic layer can be a layer having insulating properties. In the present invention and the present specification, the "insulating properties" means that the electrical conductivity is smaller than 1 siemens (S)/m. The electrical conductivity of a certain layer is calculated according to the following expression from the surface electrical resistivity of the layer and the thickness of the layer. The electrical conductivity can be measured by a known method.

$$\text{Electrical conductivity } [\text{S/m}] =$$
$$1 / (\text{surface electrical resistivity } [\Omega] \times \text{thickness } [\text{m}])$$

The inventors of the present invention presume that it is preferable that the magnetic layer is a layer having insulating properties in order for the electromagnetic wave shielding material to exhibit a higher electromagnetic wave shielding ability. From this point, the electrical conductivity of the magnetic layer is preferably smaller than 1 S/m, more preferably 0.5 S/m or less, still more preferably 0.1 S/m or less, and even still more preferably 0.05 S/m or less. The electrical conductivity of the magnetic layer can be, for example, $1.0 \times 10^{-12}$ S/m or more or $1.0 \times 10^{-10}$ S/m or more.

In addition to the above-described components, the magnetic layer can also contain any amount of one or more known additives such as a curing agent, a dispersing agent, a stabilizer, and a coupling agent.

The electromagnetic wave shielding material includes at least one magnetic layer. More specifically, it can include only one magnetic layer or can also include two or more magnetic layers having the same composition and/or thickness, or having a different composition and/or thickness.

In a case where the electromagnetic wave shielding material includes only one magnetic layer, the thickness of this one magnetic layer can be, for example, 5 μm or more, and it is preferably 10 μm or more and more preferably 20 μm or more from the viewpoint of further improving the shielding ability against electromagnetic waves. In addition, the thickness of this one magnetic layer can be, for example, 100 μm or less or 90 μm or less, and it is preferably less than 90 μm, more preferably 80 μm or less, and still more preferably 70 μm or less, from the viewpoint of further improving formability.

In a case where the electromagnetic wave shielding material includes two or more magnetic layers, the thickness of each of the two or more magnetic layers (that is, the thickness per one layer) can be, for example, 5 μm or more, and it is preferably 10 μm or more and more preferably 20 μm or more from the viewpoint of further improving the shielding ability against electromagnetic waves. In addition, the thickness of this one magnetic layer can be, for example, 100 μm or less or 90 μm or less, and it is preferably less than 90 μm and more preferably 80 μm or less, from the viewpoint of further improving formability. The respective thicknesses of the two or more magnetic layers can be the same thickness or thicknesses different from each other.

The thickness of each layer included in the electromagnetic wave shielding material shall be determined by imaging a cross section exposed by a known method with a scanning electron microscope (SEM) and determining an arithmetic average of thicknesses of five randomly selected points in the obtained SEM image.

<Pressure-Sensitive Adhesive Layer>

The electromagnetic wave shielding material includes one or more pressure-sensitive adhesive layers. The inventors of the present invention speculate that a case where the electromagnetic wave shielding material includes a pressure-sensitive adhesive layer contributes to controlling the 150° C.-tensile test elongation rate within the above-described range. At least one pressure-sensitive adhesive layer can be located in the electromagnetic wave shielding material, as a layer that is in direct contact with the magnetic layer. In the present invention and the present specification, the phrase "in direct contact" regarding two layers refers to that another layer is not interposed between these two layers. In addition, in the present invention and the present specification, the "pressure-sensitive adhesive layer" refers to a layer having tackiness on a surface at normal temperature. Here, the "normal temperature" shall be defined as 23° C. In a case where such a layer comes into contact with an adherend, the layer adheres to the adherend due to the adhesive force thereof. In general, tackiness is the property of exhibiting an adhesive force in a short time after coming into contact with an adherend with a very light force, and in the present invention and the present specification, "having tackiness" refers to that the result is No. 1 to No. 32 in a tilted ball tack test (measurement environment: a temperature of 23° C. and a relative humidity of 50%) specified in JIS Z 0237: 2009. In a case where another layer is laminated on the surface of the pressure-sensitive adhesive layer, the surface of the pressure-sensitive adhesive layer exposed, for example, by peeling off the other layer can be subjected to the above-described test. In a case where another layer is laminated on each of one surface and the other surface of the pressure-sensitive adhesive layer, the layer on the side of either surface may be peeled off.

In one form, the glass transition temperature Tg of the pressure-sensitive adhesive layer can be, for example, lower than 50° C., 45° C. or lower, or 40° C. or lower, and it can be, for example, −30° C. or higher. It is noted that the glass transition temperature Tg of the pressure-sensitive adhesive layer is determined as an intermediate temperature between a descent start point and a descent end point of a differential scanning calorimetry (DSC) chart from the measurement result of the heat flow measurement using a differential scanning calorimeter.

As the pressure-sensitive adhesive layer, it is possible to use those obtained by applying a composition for forming a pressure-sensitive adhesive layer containing a pressure sensitive adhesive such as an acrylic pressure sensitive adhesive, a rubber-based pressure-sensitive adhesive, a silicone-based pressure-sensitive adhesive, or a urethane-based pressure-sensitive adhesive and processing it into a film shape.

The composition for forming a pressure-sensitive adhesive layer can be also applied onto, for example, a support. The coating can be carried out using a known coating device such as a blade coater or a die coater. The coating can be carried out by a so-called roll-to-roll method or a batch method.

Examples of the support onto which the composition for forming a pressure-sensitive adhesive layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. As the support, it is possible to use a support in which a surface (a surface to be coated) onto which the composition for forming a pressure-sensitive adhesive layer is applied is subjected to a peeling treatment according to a known method. One form of the peeling treatment includes forming a release layer. In addition, a commercially available peeling-treated resin film can also be used as the support. In a case of using a support in which the surface to be coated is subjected to the peeling treatment, it is possible to easily separate the pressure-sensitive adhesive layer and the support after the film formation.

An electromagnetic wave shielding material in which a magnetic layer and a pressure-sensitive adhesive layer are laminated can be produced by applying a composition for forming a pressure-sensitive adhesive layer, in which a pressure sensitive adhesive is dissolved and/or dispersed in a solvent, onto the magnetic layer and carrying out drying.

A pressure sensitive adhesive tape including a pressure-sensitive adhesive layer can also be used for producing an electromagnetic wave shielding material having a pressure-sensitive adhesive layer. As the pressure sensitive adhesive tape, it is possible to use a double-sided tape. In the double-sided tape, pressure-sensitive adhesive layers are respectively provided on both surfaces of the support, and the pressure-sensitive adhesive layers on both surfaces can each have tackiness at normal temperature. In addition, as the pressure sensitive adhesive tape, it is possible to use a pressure sensitive adhesive tape in which a pressure-sensitive adhesive layer is provided on one surface of a support. Examples of the support include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide, a non-woven fabric, and paper. As the pressure sensitive adhesive tape in which the pressure-sensitive adhesive layer is provided on one surface or both surfaces of a support, it is possible to use a commercially available product, or it is possible to use a double-sided tape produced by a known method.

The electromagnetic wave shielding material can have one or more pressure-sensitive adhesive layers. Specifically, it can have only one pressure-sensitive adhesive layer, or can also have two or more pressure-sensitive adhesive layers having the same composition and/or thickness, or having a different composition and/or thickness. The total number of layers of the pressure-sensitive adhesive layer included in the electromagnetic wave shielding material can be, for example, one layer or more and four layers or less, or can be one layer or two layers.

In a case where the electromagnetic wave shielding material includes only one pressure-sensitive adhesive layer, the thickness of this one pressure-sensitive adhesive layer can be, for example, 0.5 μm or more, and it is preferably 1 μm or more and more preferably 2 μm or more. In addition, the thickness of this one pressure-sensitive adhesive layer can be, for example, 20 μm or less or 10 μm or less.

In a case where the electromagnetic wave shielding material includes two or more pressure-sensitive adhesive layers, the thickness (that is, the thickness per one layer) of each of the two or more pressure-sensitive adhesive layers can be, for example, 0.5 μm or more, and it is preferably 0.8 μm or more and more preferably 1.5 μm or more. In addition, the thickness of this one pressure-sensitive adhesive layer can be, for example, 10 μm or less or 5 μm or less. The respective thicknesses of the two or more pressure-sensitive adhesive layers can be the same thickness or thicknesses different from each other.

In one form, the electromagnetic wave shielding material can be an electromagnetic wave shielding material that is composed of two layers of one magnetic layer and one pressure-sensitive adhesive layer. In another form, the electromagnetic wave shielding material can be an electromagnetic wave shielding material that is composed of three layers of a magnetic layer, a pressure-sensitive adhesive layer, and a magnetic layer, where these three layers are included in this order. In addition, in another form, the electromagnetic wave shielding material can have a resin layer between two pressure-sensitive adhesive layers. For example, the electromagnetic wave shielding material can include a laminated structure having the magnetic layer and a resin layer between two pressure-sensitive adhesive layers. In the laminated structure having a resin layer between two pressure-sensitive adhesive layers, the resin layer can be a layer that is in direct contact with one or both of the two pressure-sensitive adhesive layers, and it is preferably a layer that is in direct contact with both of the pressure-sensitive adhesive layers. In one form, the electromagnetic wave shielding material can be an electromagnetic wave shielding material that is composed of four layers of a magnetic layer, a pressure-sensitive adhesive layer, a resin layer, and a pressure-sensitive adhesive layer, where these four layers are included in this order. In addition, in another form, the electromagnetic wave shielding material can have a laminated structure having a resin layer between two pressure-sensitive adhesive layers, on both surfaces of the magnetic layer. Examples of the electromagnetic wave shielding material having such a configuration include an electromagnetic wave shielding material that is composed of seven layers of a pressure-sensitive adhesive layer, a resin layer, a pressure-sensitive adhesive layer, a magnetic layer, a pressure-sensitive adhesive layer, a resin layer, and a pressure-sensitive adhesive layer, where these seven layers are included in this order. In addition, in another form, the electromagnetic wave shielding material can be an electromagnetic wave shielding material in which a metal layer described later is further included in each of the above layer configurations.

A case where the electromagnetic wave shielding material has a resin layer between two pressure-sensitive adhesive layers is preferable from the viewpoint of controlling the 150° C.-tensile test elongation rate within a more suitable range. In the present invention and the present specification, the "resin layer" refers to a layer containing a resin, and can be a layer containing a resin as a main component. The main component refers to a component that accounts for the largest amount on a mass basis among the components constituting a layer. The content of the resin of the resin layer is preferably 50% by mass or more, more preferably 70% by mass or more, and still more preferably 90% by mass or more, with respect to the total mass of the resin layer. In addition, the content of the resin in the resin layer can be, for example, 100% by mass or less, less than 100%, or 99% by mass or less, with respect to the total mass of the resin layer. The resin layer includes one kind or two or more kinds of resins and can also contain any amount of one or more known additives such as a plasticizer, a curing agent, a dispersing agent, a stabilizer, and a coupling agent in addition to the resin.

As the resin layer, it is possible to use, for example, a resin film commercially available as a resin film that can be used as a plastic base material, or a resin film manufactured by a known method. Examples of the resin contained in the resin layer include resins such as polyethylene terephthalate, polybutylene terephthalate, polyethylene naphthalate, polyethylene, polypropylene, cellophane, cellulose diacetate, triacetyl cellulose, cellulose acetate butyrate, polyvinyl chloride, polyvinylidene chloride, polyvinyl alcohol, ethylene-vinyl acetate copolymer, polystyrene, polycarbonate, polymethylpentene, polysulfone, polyether ether ketone, polyether sulfone, polyetherimide, polyimide, a fluororesin, nylon, an acrylic resin, polyamide, cycloolefin, and polyether sulfane. Among them, a resin film such as polyethylene terephthalate, polyethylene naphthalate, or nylon is preferable from the viewpoint of high mechanical strength. One form of the above-described resin layer is a support of the above-described double-sided tape.

From the viewpoint of controlling the 150° C.-tensile test elongation rate within a more suitable range, the thickness of the resin layer is preferably 0.1 μm or more and more preferably 1 μm or more. In addition, from the viewpoint of further improving the formability and reducing the layer thickness of the electromagnetic wave shielding material, the thickness of the resin layer is preferably 100 μm or less, more preferably 10 μm or less, and still more preferably less than 10 μm. The electromagnetic wave shielding material can include only one resin layer disposed between two pressure-sensitive adhesive layers or can include two or more layers (for example, two layers or three layers) thereof.

The glass transition temperature Tg of the resin layer can be, for example, 50° C. or higher or can be 60° C. or higher or 70° C. or higher, and it can be, for example, 150° C. or lower, 130° C. or lower, or 110° C. or lower. The glass transition temperature Tg of the resin layer is determined as an intermediate temperature between a descent start point and a descent end point of a differential scanning calorimetry (DSC) chart from the measurement result of the heat flow measurement using a differential scanning calorimeter.

<Metal Layer>

In the present invention and the present specification, the "metal layer" shall refer to a layer containing a metal. The metal layer can be a layer containing one or more kinds of metals as a pure metal consisting of a single metal element, as an alloy of two or more kinds of metal elements, or as an alloy of one or more kinds of metal elements and one or more kinds of non-metal elements.

The electromagnetic wave shielding material can further include one or two or more metal layers. The two or more metal layers have the same composition and thickness in one form and differ in composition and/or thickness in another form. In the electromagnetic wave shielding material including two or more metal layers, one or more magnetic layers can be disposed at a position sandwiched between the two metal layers. Here, the magnetic layer sandwiched between the two metal layers can be a layer that is in direct contact with one or both of the two metal layers or can be a layer that is in indirect contact therewith by interposing one or more layers (for example, a pressure-sensitive adhesive layer). The metal layer can be, for example, one or both outermost layers of the electromagnetic wave shielding material. In addition, in one form, the electromagnetic wave shielding material can have a metal layer, the above-described laminated structure (that is, a laminated structure having a resin layer between two pressure-sensitive adhesive layers), a magnetic layer, the above-described laminated structure, and a metal layer in this order. In such a form, the electromagnetic wave shielding material can be, for example, an electromagnetic wave shielding material that is composed of nine layers of a metal layer, a pressure-sensitive adhesive layer, a resin layer, a pressure-sensitive adhesive layer, a magnetic layer, a pressure-sensitive adhesive layer, a resin layer, a pressure-sensitive adhesive layer, and a metal layer, where these nine layers are included in this order. Further, it can also include a metal layer, the above-described laminated structure (that is, a laminated structure having a resin layer between two pressure-sensitive adhesive layers), a magnetic layer, the above-described laminated structure, a metal layer, the above-described laminated structure, a magnetic layer, the above-described laminated structure, and a metal layer, in this order. In such a form, the electromagnetic wave shielding material can be, for example, an electromagnetic wave shielding material that is composed of 17 layers of a metal layer, a pressure-sensitive adhesive layer, a resin layer, a pressure-sensitive adhesive layer, a magnetic layer, a pressure-sensitive adhesive layer, a resin layer, a pressure-sensitive adhesive layer, a metal layer, a pressure-sensitive adhesive layer, a resin layer, a pressure-sensitive adhesive layer, a magnetic layer, a pressure-sensitive adhesive layer, a resin layer, a pressure-sensitive adhesive layer, and a metal layer, where these 17 layers are included in this order. A configuration in which a magnetic layer is sandwiched between two metal layers is preferable from the viewpoint of improving the shielding ability against a magnetic field wave having a frequency in a range of 0.01 to 100 MHz.

As the metal layer, a layer containing one or more kinds of metals selected from the group consisting of various pure metals and various alloys can be used. The metal layer can exhibit an attenuation effect in the shielding material. Since the attenuation effect increases as the propagation constant increases and the propagation constant increases as the electrical conductivity increases, it is preferable that the metal layer contains a metal element having a high electrical conductivity. From this point, it is preferable that the metal layer contains a pure metal of Ag, Cu, Au, or Al, or an alloy containing any one of these as a main component. The pure metal is a metal consisting of a single metal element and may contain a trace amount of impurities. In general, a metal having a purity of 99.0% or more consisting of a single metal element is called a pure metal. The purity is based on mass. The alloy is generally prepared by adding one or more kinds of metal elements or non-metal elements to a pure metal to adjust the composition, for example, in order to prevent corrosion or improve the hardness. The main component in the alloy is a component having the highest ratio on a mass basis, and it can be, for example, a component that occupies 80.0% by mass or more (for example, 99.8% by mass or less) in the alloy. From the viewpoint of economic efficiency, the alloy is preferably an alloy of a pure metal of Cu or Al or an alloy containing Cu or Al as a main component, and from the viewpoint of high electrical conductivity, it is preferably an alloy of a pure metal of Cu or an alloy containing Cu as a main component.

The purity of the metal in the metal layer, that is, the content of the metal can be 99.0% by mass or more, where it is preferably 99.5% by mass or more, and more preferably 99.8% by mass or more with respect to the total mass of the metal layer. Unless otherwise specified, the content of metal in the metal layer shall refer to the content on a mass basis. For example, as the metal layer, a pure metal or an alloy processed into a sheet shape can be used. For example, as the metal layer, a commercially available metal foil or a metal foil produced by a known method can be used. Regarding a pure metal of Cu, sheets (so-called copper foils) having various thicknesses are commercially available. For example, such a copper foil can be used as the metal layer. The copper foil includes, according to manufacturing methods thereof, an electrolytic copper foil obtained by precipitating a copper foil on a cathode by electroplating and a rolled copper foil obtained by applying heat and pressure to an ingot and stretching the ingot thinly. Any copper foil can be used as the metal layer of the electromagnetic wave shielding material. In addition, for example, regarding Al, sheets (so-called aluminum foils) having various thicknesses are commercially available. For example, such an aluminum foil can be used as the metal layer.

From the viewpoint of reducing the weight of the electromagnetic wave shielding material, one or both (preferably both) of the two metal layers included in the multilayer structure is preferably a metal layer containing a metal selected from the group consisting of Al and Mg. This is because a value (specific gravity/electrical conductivity) obtained by dividing the specific gravity by the electrical conductivity is small both in Al and Mg. As a metal in which this value is smaller is used, the weight of the electromagnetic wave shielding material that exhibits a high shielding ability can be further reduced. As a value calculated from the literature value, for example, a value (specific gravity/electrical conductivity) obtained by dividing the specific gravity by the electrical conductivity of each of Cu, Al, and Mg is as follows. Cu: $1.5 \times 10^{-7}$ m/S, Al: $7.6 \times 10^{-8}$ m/S, Mg: $7.6 \times 10^{-8}$ m/S. From the above values, it can be said that Al and Mg are preferred metals from the viewpoint of reducing the weight of the electromagnetic wave shielding material. The metal layer containing a metal selected from the group consisting of Al and Mg can contain only one of Al and Mg in one form and can contain both in another form. From the viewpoint of reducing the weight of the electromagnetic wave shielding material, one or both (preferably both) of the two metal layers included in the multilayer structure are preferably a metal layer in which the content of the metal selected from the group consisting of Al and Mg is 80.0% by mass or more, and still more preferably a metal layer in which the content of the metal selected from the group consisting of Al and Mg is 90.0% by mass or more. The metal layer containing at least Al among Al and Mg can be a metal layer in which the Al content is 80.0% by mass or more, and it can be a metal layer in which the Al content is 90.0% by mass or more. The metal layer containing at least Mg among Al and Mg can be a metal layer in which the Mg content is 80.0% by mass or more, and it can be a metal layer in which the Mg content is 90.0% by mass or more. The content of the metal selected from the group consisting of Al and Mg, the Al content, and the Mg content can be each, for example, 99.9% by mass or less. The content of the metal selected from the group consisting of Al and Mg, the Al content, and the Mg content are each the content with respect to the total mass of the metal layer.

<E' at 60° C.>

Regarding the viscoelasticity, from the viewpoint that the electromagnetic wave shielding material can exhibit elongatability that is more suitable for a forming method of forming a heated forming target, the storage elastic modulus E' of the electromagnetic wave shielding material in the dynamic viscoelasticity measurement at 1 Hz is preferably 0.010 GPa or more and more preferably 0.020 or more at 60° C. In addition, from the above viewpoint, the E' at 60° C. of the electromagnetic wave shielding material is preferably less than 10.000 GPa, more preferably 9.000 GPa or less, and still more preferably 5.000 GPa or less. E' at 60° C. can be controlled by a kind of a layer constituting the electromagnetic wave shielding material, a kind and a content of the resin contained in the magnetic layer, or the like. Examples of the means for controlling E' at 60° C. within the above-described range include providing a pressure-sensitive adhesive layer in the electromagnetic wave shielding material, using a resin having a glass transition temperature in the range described above, as the resin in the magnetic layer, and setting the content of the resin in the magnetic layer within the range described above.

In the present invention and the present specification, the E' at 60° C. of the electromagnetic wave shielding material is determined according to the dynamic viscoelasticity measurement described below.

The dynamic viscoelasticity measurement is carried out using a dynamic viscoelasticity measuring device. As the dynamic viscoelasticity measuring device, for example, a dynamic viscoelasticity measuring device DMS6100 manufactured by Hitachi High-Tech Science Corporation can be used, and this device was used in Examples which will be described later.

The measurement procedure is as follows.

A measurement sample having a length of 28 mm and a width of 10 mm is cut out from an electromagnetic wave shielding material to be measured. In the dynamic viscoelasticity measuring device, the viscoelasticity of the above-described measurement sample is measured under the following measurement conditions. By such measurement, a storage elastic modulus E' at 60° C. (E' at 60° C.) is determined.

(Measurement Conditions)

Distance between chucks: 10 mm
Measurement temperature range: −50° C. to 100° C.
Temperature rising rate: 2° C./min
Sampling rate: 3 seconds
Measurement frequency: 1 Hz <Manufacturing Method for Electromagnetic Wave Shielding Material>

(Film Forming Method for Magnetic Layer)

The magnetic layer can be produced, for example, by drying a coating layer that is proved by applying a composition for forming a magnetic layer. The composition for forming a magnetic layer contains the components described above and can optionally contain one or more kinds of solvents. Examples of the solvent include various organic solvents, for example, ketone-based solvents such as acetone, methyl ethyl ketone, and cyclohexanone, acetic acid ester-based solvents such as ethyl acetate, butyl acetate, cellosolve acetate, propylene glycol monomethyl ether acetate, and carbitol acetate, carbitols such as cellosolve and butyl carbitol, aromatic hydrocarbon-based solvents such as toluene and xylene, and amide-based solvents such as dimethylformamide, dimethylacetamide, and N-methylpyrrolidone. One kind of solvent or two or more kinds of solvents selected in consideration of the solubility of the component that is used in the preparation of the composition for forming a magnetic layer can be mixed at any ratio and used. The solvent content of the composition for forming a magnetic layer is not particularly limited and may be determined in consideration of the coatability of the composition for forming a magnetic layer.

The composition for forming a magnetic layer can be prepared by sequentially mixing various components in any order or simultaneously mixing them. In addition, as necessary, a dispersion treatment can be carried out using a known dispersing machine such as a ball mill, a bead mill, a sand mill, or a roll mill, and/or a stirring treatment can be also carried out using a known stirrer such as a shaking type stirrer.

The composition for forming a magnetic layer can be applied onto, for example, a support. The coating can be carried out using a known coating device such as a blade coater or a die coater. The coating can be carried out by a so-called roll-to-roll method or a batch method.

Examples of the support onto which the composition for forming a magnetic layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. For these resin films, reference can be made to paragraphs 0081 to 0086 of JP2015-187260A. As the support, it is possible to use a support in which a surface (a surface to be coated) onto which the composition for forming a magnetic layer is applied is subjected to a peeling treatment according to a known method. One form of the peeling treatment includes forming a release layer. For the release layer, reference can be made to paragraph 0084 of JP2015-187260A. In addition, a commercially available peeling-treated resin film can also be used as the support. In a case of using a support in which the surface to be coated is subjected to the peeling treatment, it is possible to easily separate the magnetic layer and the support after the film formation.

In one form, by using, as a support, a pressure-sensitive adhesive layer or using, as a support, a pressure sensitive adhesive tape having a pressure-sensitive adhesive layer, or using, as a support, a laminated structure having a resin layer between two layers, it is also possible to directly apply a composition for forming a magnetic layer onto a pressure-sensitive adhesive layer or the pressure-sensitive adhesive layer of the above-described laminated structure.

A coating layer formed by applying the composition for forming a magnetic layer can be subjected to a drying treatment according to a known method such as heating or warm air blowing. The drying treatment can be carried out, for example, under conditions in which the solvent contained in the composition for forming a magnetic layer can be volatilized. As an example, the drying treatment can be carried out for 1 minute to 2 hours in a heated atmosphere having an atmospheric temperature of 80° C. to 150° C.

The alignment degree of the flat-shaped particle described above can be controlled by a solvent kind, solvent amount, liquid viscosity, coating thickness, and the like of the composition for forming a magnetic layer. For example, in a case where the boiling point of the solvent is low, convection occurs due to drying, and thus the value of the alignment degree tends to be large. In a case where the solvent amount is small, the value of the alignment degree tends to increase due to physical interference between adjacent flat-shaped particles. On the other hand, in a case where the liquid viscosity is low, the rotation of flat-shaped particles is difficult to occur, and thus the value of the alignment degree tends to be small. The value of the alignment degree tends to be small as the coating thickness decreases. In addition, carrying out a pressurization treatment described later can contribute to reducing the value of the alignment degree. In a case of adjusting the various manufacturing conditions described above, the alignment degree of the flat-shaped particles can be controlled within the range described above.
(Pressurization Treatment of Magnetic Layer)

The magnetic layer can also be subjected to a pressurization treatment after film formation. In a case of subjecting the magnetic layer containing the magnetic particles to a pressurization treatment, it is possible to increase the density of the magnetic particles in the magnetic layer, and it is possible to obtain a higher magnetic permeability. In addition, in the magnetic layer containing the flat-shaped particles, it is possible to reduce the value of the alignment degree by the pressurization treatment, and it is possible to obtain a higher magnetic permeability.

The pressurization treatment can be carried out by applying pressure in the thickness direction of the magnetic layer using a flat plate pressing machine, a roll pressing machine, or the like. In the flat plate pressing machine, an object to be pressurized is disposed between two flat press plates that are disposed vertically, and the two press plates are put together by mechanical or hydraulic pressure to apply pressure to the object to be pressurized. In the roll pressing machine, an object to be pressurized is allowed to pass between the rotating pressurization rolls that are disposed vertically, and at that time, mechanical or hydraulic pressure is applied to the pressurization rolls, or the distance between the pressurization rolls is made to be smaller than the thickness of the object to be pressurized, whereby the pressure can be applied.

The pressure during the pressurization treatment can be set freely. For example, in a case of a flat plate pressing machine, it is, for example, 1 to 50 newtons (N)/mm². In a case of a roll pressing machine, it is, for example, 20 to 400 N/mm in terms of the linear pressure.

The pressurization time can be set freely. It takes, for example, 5 seconds to 4 hours in a case where a flat plate pressing machine is used. In a case where a roll pressing machine is used, the pressurization time can be controlled by the transport speed of the object to be pressurized, where the transport speed is, for example, 10 cm/min to 200 m/min.

The materials of the press plate and the pressurization roll can be randomly selected from metal, ceramics, plastic, and rubber.

In the pressurization treatment, it is also possible to carry out a pressurization treatment by applying a temperature to both of upper and lower press plates of a plate-shape pressing machine or one press plate thereof, or one roll of upper and lower rolls of a roll pressing machine. The magnetic layer can be softened by heating, which makes it possible to obtain a high compression effect in a case where pressure is applied. The temperature at the time of heating can be set freely, and it is, for example, 50° C. or higher and 200° C. or lower. The temperature at the time of heating can be the internal temperature of the press plate or the roll. Such a temperature can be measured with a thermometer installed inside the press plate or the roll.

After the heating and pressurization treatment with the plate-shape pressing machine, the press plates can be spaced apart from each other, for example, in a state where the temperature of the press plates is high, whereby the magnetic layer can be taken out. Alternatively, the press plate can be cooled by a method such as water cooling or air cooling while maintaining the pressure, and then the press plates can be spaced apart to take out the magnetic layer.

In the roll pressing machine, the magnetic layer can be cooled immediately after pressing, by a method such as water cooling or air cooling.

It is also possible to repeat the pressurization treatment two or more times.

In a case where the magnetic layer is formed into a film on a release film, it is possible to carry out a pressurization treatment, for example, in a state where the magnetic layer is laminated on the release film. Alternatively, the magnetic layer can also be peeled off from the release film and can be subjected to a pressurization treatment as a single layer of the magnetic layer.
(Lamination of Various Layers)

As described above, the pressure-sensitive adhesive layer can be bonded to the magnetic layer as a pressure sensitive adhesive tape or can be laminated with the magnetic layer by applying a composition for forming a pressure-sensitive adhesive layer onto the magnetic layer and carrying out drying.

The metal layer can be incorporated into the electromagnetic wave shielding material as a layer that is in direct contact with the pressure-sensitive adhesive layer, for example, by being bonded to the pressure-sensitive adhesive layer.

In addition, in the electromagnetic wave shielding material, two layers adjacent to each other can be also adhered to each other, for example, by applying pressure and heat to carry out crimping. A flat plate pressing machine, a roll pressing machine, or the like can be used for the crimping. For example, in a case where the magnetic layer is disposed as a layer that is in direct contact with the metal layer, the magnetic layer is softened in a crimping step, and the contact with the surface of the metal layer is promoted, whereby the two layers adjacent to each other can be adhered to each other. The pressure at the time of crimping can be set freely. It is, for example, 1 to 50 N/mm² in a case of a flat plate pressing machine. In a case of a roll pressing machine, it is, for example, 20 to 400 N/mm in terms of the linear pressure. The pressurization time at the time of crimping can be set freely. It takes, for example, 5 seconds to 30 minutes in a case where a flat plate pressing machine is used. In a case where a roll pressing machine is used, the pressurization time can be controlled by a transport speed of an object to be pressurized, and the transport speed is, for example, 10 cm/min to 200 m/min. The temperature at the time of crimping can be randomly selected. For example, it is 50° C. or higher and 200° C. or lower.

The electromagnetic wave shielding material can be incorporated into, in any shape, an electronic component or an electronic apparatus. The electromagnetic wave shielding material can have a sheet shape, where the size thereof is not particularly limited. In the present invention and the present specification, the "sheet" has the same meaning as the "film". In addition, the electromagnetic wave shielding material can be a three-dimensionally formed article obtained by three-dimensionally forming a sheet-shaped electromagnetic wave shielding material, or it can also be a sheet-shaped electromagnetic wave shielding material for three-dimensional forming. As a three-dimensional forming method, it is possible to use various forming methods such as mold press forming, vacuum forming, and air pressure forming. Among them, it is preferable to apply a forming method such as air pressure forming or vacuum forming to the electromagnetic wave shielding material since the electromagnetic wave shielding material has excellent formability in a forming method of three-dimensionally forming a heated forming target. The electromagnetic wave shielding material can be an electromagnetic wave shielding material that is difficult to be broken in a case of being three-dimensionally formed by such a forming method. Known techniques can be applied to the three-dimensional forming method.

[Electronic Component]

One aspect of the present invention relates to an electronic component including the electromagnetic wave shielding material. Examples of the electronic component include an electronic component included in an electronic apparatus such as a mobile phone, a mobile information terminal, and a medical device, and various electronic components such as a semiconductor element, a capacitor, a coil, and a cable. The electromagnetic wave shielding material is three-dimensionally formed into any shape, for example, according to the shape of the electronic component, thereby capable of being disposed in the inside of the electronic component, or it is three-dimensionally formed into a shape of a cover material, thereby capable of being disposed as a cover material that covers the outside of the electronic component. Alternatively, it can be three-dimensionally formed into a tubular shape, thereby being disposed as a cover material that covers the outside of the cable.

[Electronic Apparatus]

One aspect of the present invention relates to an electronic apparatus including the electromagnetic wave shielding material. Examples of the electronic apparatus include electronic apparatuses such as a mobile phone, a mobile information terminal, and a medical device, electronic apparatuses including various electronic components such as a semiconductor element, a capacitor, a coil, and a cable, and electronic apparatuses in which electronic components are mounted on a circuit board. Such an electronic apparatus can include the electromagnetic wave shielding material as a constitutional member of an electronic component included in the device. In addition, as a constitutional member of the electronic apparatus, the electromagnetic wave shielding material can be disposed in the inside of the electronic apparatus or can be disposed as a cover material that covers the outside of the electronic apparatus. Alternatively, it can be three-dimensionally formed into a tubular shape, thereby being disposed as a cover material that covers the outside of the cable.

Examples of the usage form of the electromagnetic wave shielding material include a usage form in which a semiconductor package on a printed board is coated with a shielding material. For example, "Electromagnetic wave shielding technology in a semiconductor package" (Toshiba Review Vol. 67, No. 2 (2012) P. 8) discloses a method of obtaining a high shielding effect by electrically connecting a side via of an end part of a package substrate and an inner surface of a shielding material in a case where a semiconductor package is coated with a shielding material, thereby carrying out ground wiring. In order to carry out such wiring, it is desirable that the outermost layer of the shielding material on the electronic component side is a metal layer. In one form, since one or both outermost layers of the shielding material can be a metal layer in the electromagnetic wave shielding material, the electromagnetic wave shielding material can be suitably used in a case of carrying out the wiring as described above.

EXAMPLES

Hereinafter, the present invention will be described in more detail with reference to Examples. However, the present invention is not limited to the embodiments shown in Examples.

[Resin of Magnetic Layer]

The resin of the magnetic layer shown in Table 1 is the following resin. In Table 1, the polyester urethane resin is denoted as "polyester urethane", and the silicone resin is denoted as "silicone".

The polyester urethane resin having a glass transition temperature Tg of −30° C. is UR-6100 manufactured by TOYOBO Co., Ltd.

The polyester urethane resin having a glass transition temperature Tg of −11° C. is a resin obtained by mixing UR-8300 manufactured by TOYOBO Co., Ltd. and UR-8700 manufactured by TOYOBO Co., Ltd. at a mass ratio of 1:3.

The polyester urethane resin having a glass transition temperature Tg of 23° C. is UR-8300 manufactured by TOYOBO Co., Ltd.

The polyester urethane resin having a glass transition temperature Tg of −48° C. is a resin obtained by mixing UR-8200 manufactured by TOYOBO Co., Ltd. and UR-8300 manufactured by TOYOBO Co., Ltd. at a mass ratio of 1:1.

The silicone resin having a glass transition temperature Tg of −13° C. is a silicone rubber KE-541-U manufactured by Shin-Etsu Silicones Co., Ltd.

The glass transition temperature of the resin shown in Table 1 is a value determined according to the following method.

The same resin (a pellet-shaped or powder-shaped specimen) as the resin used in the preparation of the composition for forming a magnetic layer (the coating liquid) was placed in a specimen pan made of aluminum and sealed with a pressing machine, and the heat flow was measured under the following conditions using Q100 manufactured by TA Instruments as a differential scanning calorimeter. From the measurement results, the glass transition temperature of the resin was determined as the baseline shift start temperature in the heat flowchart at the time of temperature rise.

(Measurement Conditions)

Scanning temperature: −80.0° C. to 200.0° C.

Temperature rising rate: 10.0° C./min

Example 1

<Preparation of Composition for Forming Magnetic Layer (Coating Liquid)>

To a plastic bottle, the following substances were added and mixed with a shaking type stirrer for 1 hour to prepare a coating liquid;

36 g of Fe—Si—Al flat-shaped magnetic particles (Sendust MFS-SUH manufactured by MKT), 20 g of a polyester urethane resin (see Table 1, concentration of solid contents: 45% by mass), 0.45 g of a polyfunctional isocyanate (CORONATE L manufactured by Tosoh Corporation), and 84 g of cyclohexanone.

<Production of Magnetic Layer>

(Formation of Film of Magnetic Layer)

A coating liquid was applied onto a peeling surface of a peeling-treated PET film (PET75TR manufactured by NIPPA Co., Ltd., hereinafter also described as a "release film") with a blade coater having a coating gap of 300 μm and dried for 60 minutes in a drying device having an internal atmosphere temperature of 80° C. to form a film of a film-shaped magnetic layer. Then, in order to carry out a crosslinking reaction between a polyester urethane resin contained in the magnetic layer, and a polyfunctional isocyanate, the magnetic layer on the release film was held for 48 hours together with the release film in a drying device having an internal atmosphere temperature of 60° C.

(Pressurization Treatment of Magnetic Layer)

Upper and lower press plates of a plate-shape pressing machine (a large-scale hot press TA-200-1 W manufactured by YAMAMOTO ENG. WORKS Co., LTD.) were heated to 140° C. (the internal temperature of the press plate), and the magnetic layer on the release film was installed in the center of the press plate together with the release film and held for 10 minutes in a state where a pressure of 4.66 N/mm² was applied. The upper and lower press plates were cooled to 50° C. (the internal temperature of the press plates) while maintaining the pressure, and then the magnetic layer was taken out together with the release film.

<Production of Shielding Material>

As a double-sided tape in which pressure-sensitive adhesive layers were disposed on both surfaces of a support, MK6G manufactured by Iwatani Corporation was used. The double-sided tape is a double-sided tape composed of five layers of a polyethylene terephthalate (PET) film for release (light release), a pressure-sensitive adhesive layer (acrylic pressure sensitive adhesive-containing layer), a PET film (a support (the glass transition temperature Tg determined by the method described above as a measuring method for the glass transition temperature of the resin layer: 70° C.)), a pressure-sensitive adhesive layer (acrylic pressure sensitive adhesive-containing layer), and a PET film for release (strong release), where each of the two pressure-sensitive adhesive layers disposed on both surfaces of the support is a layer that corresponds to the pressure-sensitive adhesive layer described above.

A sample piece for the evaluation of each of the following measurement of magnetic permeability and measurement of electrical conductivity was cut out from a part of the magnetic layer from which the release film was already peeled off. The sample piece was cut out, and then one surface of the magnetic layer was brought into contact with the pressure-sensitive adhesive layer that had been exposed by peeling the light-release PET film from the double-sided tape, whereby the double-sided tape was bonded to the magnetic layer. Then, the strong-release PET film of the double-sided tape was peeled off to obtain a sheet-shaped electromagnetic wave shielding material that is composed of four layers of a magnetic layer, a pressure-sensitive adhesive layer, a PET film (resin layer), and a pressure-sensitive adhesive layer, where these four layers are included in this order. The PET film included in the obtained electromagnetic wave shielding material contains a resin as a main component, and the resin content thereof is 90% by mass or more.

<Measurement of Magnetic Permeability>

The magnetic layer was cut into a rectangle having a size of 28 mm×10 mm, the magnetic permeability was measured using a magnetic permeability measuring apparatus (PER01 manufactured by KEYCOM Corporation), and the magnetic permeability was determined as the real part (μ') of the complex specific magnetic permeability at a frequency of 3 MHz. The determined magnetic permeability was the value shown in Table 1. The evaluation results A to D of the magnetic permeability shown in Table 1 are based on the following evaluation standards.

A: The magnetic permeability μ' is 100 or more.

C: The magnetic permeability μ' is 40 or more and less than 100.

D: The magnetic permeability μ' is less than 40.

<Measurement of Electrical Conductivity>

A cylindrical main electrode having a diameter of 30 mm was connected to the negative electrode side of a digital super-insulation resistance meter (TR-811A manufactured by Takeda RIKEN Industries), a ring electrode having an inner diameter of 40 mm and an outer diameter of 50 mm was connected to the positive electrode side thereof, the main electrode was installed on a sample piece of the magnetic layer cut to a size 60 mm×60 mm, the ring electrode was installed at a position surrounding the main electrode, a voltage of 25 V was applied to both electrodes, and the surface electrical resistivity of the magnetic layer alone was measured. The electrical conductivity of the magnetic layer was calculated from the surface electrical resistivity and the following expression. The calculated electrical conductivity was $1.1 \times 10^{-2}$ S/m.

As the thickness, the thickness of the magnetic layer, which had been determined according to the following method, was used.

Electrical conductivity $[S/m] =$ $$1 / (\text{surface electrical resistivity } [\Omega] \times \text{thickness } [m])$$

<Acquisition of Cross-Sectional Image of Shielding Material>

Cross-section processing was carried out to expose the cross-section of the shielding material of Example 1 according to the following method.

A shielding material cut out to a size of 3 mm×3 mm was embedded in a resin, and a cross section of the shielding material was cut out with an ion milling device (IM4000PLUS manufactured by Hitachi High-Tech Corporation).

The cross-section of the shielding material, which had been exposed in this way, was observed with a scanning electron microscope (SU8220, manufactured by Hitachi High-Tech Corporation) under the conditions of an acceleration voltage of 2 kV and a magnification of 100 times to obtain a backscattered electron image. From the obtained image, the thicknesses were measured, using the scale bar as a reference, at five positions in each of four layers of a magnetic layer, a pressure-sensitive adhesive layer, a PET film (resin layer), and a pressure-sensitive adhesive layer, and the arithmetic averages of the respective layers were defined as the thickness of the magnetic layer, the thickness of each of the two pressure-sensitive adhesive layers, and the thickness of the PET film (resin layer). The thickness of the magnetic layer was 30 μm, the thickness of each of the two pressure-sensitive adhesive layers was 2 μm, and the thickness of the PET film (resin layer) was 2 μm.

<Acquisition of Cross-Sectional Image of Magnetic Layer>

In a cross section of the shielding material of Example 1, which had been exposed by the cross-section processing in the same manner as described above, a portion of the magnetic layer was observed with a scanning electron microscope (SU8220, manufactured by Hitachi High-Tech Corporation) under the conditions of an acceleration voltage of 2 kV and a magnification of 1,000 times, thereby obtaining a backscattered electron image.

<Measurement of Aspect Ratio of Magnetic Particle and Alignment Degree of Flat-Shaped Particle>

Using the backscattered electron image acquired as above, the aspect ratio of the magnetic particles was determined according to the method described above, and the flat-shaped particles were specified from the value of the aspect ratio. As a result of determining, as described above, whether or not the magnetic layer contained flat-shaped particles as the magnetic particles, it was determined that the magnetic layer contains flat-shaped particles. Further, as a result of determining the alignment degree of the magnetic particles specified as the flat-shaped particles, according to the method described above, the alignment degree was 13°. In addition, an average value (arithmetic average) of the aspect ratios of all the particles specified as the flat-shaped particles was determined as the aspect ratio of the flat-shaped particles contained in the magnetic layer. The determined aspect ratio was 0.071.

<150° C.-Tensile Test Elongation Rate>

A measurement sheet having a length of 50 mm and a width of 10 mm was cut out from the electromagnetic wave shielding material. A tensile test of this measurement sheet was carried out under the measurement conditions described above by using, as a tensile tester, an autograph (AGX-5kNVD) manufactured by Shimadzu Corporation, and the 150° C.-tensile test elongation rate was determined as described above.

<E' at 60° C.>

A measurement sample having a length of 28 mm and a width of 10 mm was cut out from the electromagnetic wave shielding material, and a dynamic viscoelasticity measuring device DMS6100 manufactured by Hitachi High-Tech Science Corporation was used as the dynamic viscoelasticity measuring device to carry out the dynamic viscoelasticity measurement according to the measurement procedure described above. E' at 60° C. was determined from the obtained measurement results.

<Formability>

The electromagnetic wave shielding material was preheated for 1 minute in a heated atmosphere having an atmospheric temperature of 250° C. and then subjected to air pressure forming to produce a hemispherical three-dimensionally formed article. The presence or absence of breakage in the produced three-dimensionally formed article was visually checked, and from the checking results, the formability was evaluated according to the following evaluation standards.

(Evaluation Standards)

A: A three-dimensionally formed article having a depth of 4.5 cm can be formed without breakage by using a hemispherical forming die having a depth of 4.5 cm.

B: A three-dimensionally formed article having a depth of 3.5 cm can be formed without breakage by using a hemispherical forming die having a depth of 3.5 cm.

Further, in a case where a hemispherical forming die having a depth of 4.5 cm was used, the breakage was observed in the obtained three-dimensionally formed article having a depth of 4.5 cm, or a three-dimensionally formed article having a depth of 4.5 cm was not obtained.

C: A three-dimensionally formed article having a depth of 2.5 cm can be formed without breakage by using a hemispherical forming die having a depth of 2.5 cm.

Further, in a case where a hemispherical forming die having a depth of 3.5 cm was used, the breakage was observed in the obtained three-dimensionally formed article having a depth of 3.5 cm, or a three-dimensionally formed article having a depth of 3.5 cm was not obtained.

D: The breakage is observed in the three-dimensionally formed article having a depth of 2.5 cm, which is obtained by using a hemispherical forming die having a depth of 2.5 cm.

Examples 2 to 8 and Comparative Examples 1, 3, and 4

An electromagnetic wave shielding material was produced and various evaluations were carried out according to the method described for Example 1, except that the items shown in Table 1 were changed as shown in Table 1 and that the blending amount of the polyfunctional isocyanate in the preparation of the composition for forming a magnetic layer was adjusted to be an amount of 5% by mass with respect to the solid contents of the resin to be used.

For each of Examples and Comparative Examples, in which the resin content of the magnetic layer was different from that of Example 1, the resin content of the magnetic layer was changed by changing the amount of the resin in the above-described composition for forming a magnetic layer.

As a result of determining the thickness of each layer in the electromagnetic wave shielding materials of Examples 2 to 7 and Comparative Example 3, according to the method described above, the thickness of each layer was the same as the value that had been determined for Example 1.

The electromagnetic wave shielding material of Comparative Example 1, which is described as "Absent" in the column of the pressure-sensitive adhesive sheet in Table 1, is an electromagnetic wave shielding material consisting of only one magnetic layer. As a result of determining the thickness of the magnetic layer in Comparative Example 1 described above, according to the method described above, it was 30 μm.

In Comparative Example 4, as a result of making an attempt to peel the magnetic layer after being subjected to the pressurization treatment, from the release film, the magnetic layer was broken and thus a sheet-shaped magnetic layer could not be obtained. Therefore, subsequent bonding to the pressure sensitive adhesive tape and various evaluations were not carried out. This is presumably due to the fact that the content of the resin of the magnetic layer is low, which causes the breakage.

The pressure sensitive adhesive tape used for Example 8 is a pressure sensitive adhesive tape NCF-D692 (5) manufactured by LINTEC Corporation. This pressure sensitive adhesive tape is a pressure sensitive adhesive tape having a three-layer configuration, which has a pressure-sensitive adhesive layer (an acrylic pressure sensitive adhesive-containing layer) between two layers of release films, where the pressure sensitive adhesive tape does not include a support. The pressure-sensitive adhesive layer of the pressure sensitive adhesive tape is a layer that corresponds to the pressure-sensitive adhesive layer described above. For Example 8, a magnetic layer was produced as described for Example 1, and a sample piece for evaluation of the above-described magnetic permeability measurement was cut out from a part of the magnetic layer from which the release film was already peeled off. The sample piece was cut out, and then one surface of the magnetic layer was brought into contact with the pressure-sensitive adhesive layer that had been exposed by peeling one release film of the pressure sensitive adhesive tape, whereby the pressure sensitive adhesive tape was bonded to the magnetic layer. Then, the other release film was peeled off to obtain an electromagnetic wave shielding material of Example 8, which is composed of two layers of a magnetic layer and a pressure-sensitive adhesive layer. As a result of determining the thickness of each layer according to the method described above, the thickness of the magnetic layer was 30 μm, and the thickness of the pressure-sensitive adhesive layer was 5 μm.

Example 9

An electromagnetic wave shielding material was produced and various evaluations were carried out according to the method described for Example 1, except that a film of the magnetic layer was formed according to the following method. As a result of determining the thickness of each thickness of each layer was the same as the value that had been determined for Example 1.

<Preparation of Composition for Forming Magnetic Layer (Coating Liquid)>

To a plastic bottle, the following substances were added and mixed with a shaking type stirrer for 12 hours to prepare a coating liquid;

12 g of Fe—Si—Al flat-shaped magnetic particles (Sendust MFS-SUH manufactured by MKT), 1 g of a silicone resin (see Table 1), 0.02 g of a curing agent (C-8, manufactured by Shin-Etsu Silicones Co., Ltd.), 14 g of methyl ethyl ketone, and 14 g of cyclohexanone.

<Production of Magnetic Layer>

(Formation of Film of Magnetic Layer)

A coating liquid was applied onto a peeling surface of a peeling-treated PET film (PET75TR manufactured by NIPPA Co., Ltd.) with a blade coater having a coating gap of 300 μm and dried for 30 minutes in a drying device having an internal atmospheric temperature of 80° C., and further, a curing reaction was carried out for 12 hours by setting an internal atmospheric temperature inside the drying device to 150° C. to form a film of a film-shaped magnetic layer.

Comparative Example 2

A noise suppression sheet, product name: Flexield (model number: IFL16-30NB) manufactured by TDK Corporation, has a magnetic sheet, a double-sided tape, and a release liner in this order. The release liner was removed from this sheet, which was subsequently used as an electromagnetic wave shielding material of Comparative Example 2 to carry out various evaluations by the above-described methods.

The above results are shown in Table 1. As the evaluation results shown in the columns of the overall evaluation in Table 1, the lower evaluation result among the evaluation results of the formability and the evaluation results of the magnetic permeability were adopted. For example, in a case where two evaluation results were A and C, respectively, the evaluation result of the overall evaluation was C.

TABLE 1

| | Pressure-sensitive adhesive sheet | Kind of resin of magnetic layer | Content of resin of magnetic layer (% by mass) | Tg of resin of magnetic layer (° C.) | E' at 60° C. (GPa) | 150° C.-tensile test elongation rate (%) | Formability evaluation | Magnetic permeability μ' (3 MHz) | Overall evaluation |
|---|---|---|---|---|---|---|---|---|---|
| Example 1 | MK6G | Polyester urethane | 20 | −30 | 0.320 | 41.0 | A | A 130 | A |
| Example 2 | MK6G | Polyester urethane | 16 | −30 | 0.410 | 35.0 | A | A 142 | A |
| Example 3 | MK6G | Polyester urethane | 8 | −30 | 0.210 | 27.0 | B | A 167 | B |
| Example 4 | MK6G | Polyester urethane | 8 | −11 | 0.240 | 24.0 | B | A 175 | B |
| Example 5 | MK6G | Polyester urethane | 8 | 23 | 0.370 | 20.0 | B | A 181 | B |
| Example 6 | MK6G | Polyester urethane | 8 | 48 | 0.440 | 6.0 | C | A 173 | C |
| Example 7 | MK6G | Polyester urethane | 30 | −30 | 0.090 | 141.0 | A | C 95 | C |
| Example 8 | D692 | Polyester urethane | 20 | −30 | 0.030 | 7.0 | C | A 130 | C |
| Example 9 | MK6G | Silicone | 8 | −13 | 0.330 | 3.4 | C | A 158 | C |
| Comparative Example 1 | Absent | Polyester urethane | 16 | −30 | 0.150 | 0.2 | D | A 142 | D |
| Comparative Example 2 | | Flexield manufactured by TDK Corporation | | | 10.200 | 4.1 | D | A 341 | D |
| Comparative Example 3 | MK6G | Polyester urethane | 45 | −30 | 0.008 | 155.0 | A | D 37 | D |
| Comparative Example 4 | Absent | Polyester urethane | 4 | −30 | | | — | | | layer in the electromagnetic wave shielding materials of Example 9 according to the method described above, the From the results shown in Table 1, it can be confirmed that the electromagnetic wave shielding materials of Examples

27 have a high magnetic permeability of the magnetic layer, an excellent shielding ability, and excellent formability.

An electromagnetic wave shielding material composed of four layers of a magnetic layer, a pressure-sensitive adhesive layer, a PET film, and a pressure-sensitive adhesive layer was obtained according to the method described for Example 1.

A surface of the electromagnetic wave shielding material, which was not bonded to the pressure-sensitive adhesive layer of the magnetic layer, was brought into contact with a pressure-sensitive adhesive layer that had been exposed by peeling the light-release PET film from a double-sided tape (MK6G, manufactured by Iwatani Corporation), whereby the double-sided tape was bonded to the magnetic layer.

Then, after peeling off the strong-release PET film of the double-sided tape, a copper foil having a thickness of 10 μm (in accordance with the JIS H3100: 2018 standard, alloy number: C1100R, copper content: 99.90% by mass or more) was bonded to each of the pressure-sensitive adhesive layers located on the outermost layers on both sides.

In this way, an electromagnetic wave shielding material, which is composed of nine layers of a metal foil (metal layer), a pressure-sensitive adhesive layer, a PET film (resin layer), a pressure-sensitive adhesive layer, a magnetic layer, a pressure-sensitive adhesive layer, a PET film (resin layer), a pressure-sensitive adhesive layer, and a metal foil (metal layer), where these nine layers are included in this order, was obtained. As a result of evaluating the shielding ability of the obtained electromagnetic wave shielding material according to the method described below, it was confirmed that the shielding ability is 14.5 dB at a frequency of 100 kHz and 73.2 dB at a frequency of 10 MHz, and thus the shielding ability against the magnetic field wave is excellent. Further, as a result of subjecting the obtained electromagnetic wave shielding material to the evaluation of formability described above, the same evaluation results as in Example 1 were obtained.

<Evaluation of Shielding Ability (KEC Method)>

A shielding material cut to a size of 150 mm×150 mm was installed between antennas of a KEC method evaluation device including a signal generator, an amplifier, a pair of magnetic field antennas, and a spectrum analyzer, and at a frequency of 100 kHz and a frequency of 10 MHz, a ratio of the intensity of the received signal in a case where the shielding material was not present to the intensity of the received signal in a case where the shielding material was present was determined and denoted as the shielding ability. The operation was carried out with the magnetic field antenna to determine the magnetic field wave shielding ability. It is noted that KEC is an abbreviation for Kansai Electronic Industry Development Center.

An electromagnetic wave shielding material composed of four layers of a magnetic layer, a pressure-sensitive adhesive layer, a PET film, and a pressure-sensitive adhesive layer was obtained according to the method described for Example 1.

A film of a magnetic layer was further formed by the method described for Example 1. The magnetic layer which had been subjected to the film formation was bonded to a pressure-sensitive adhesive layer of the electromagnetic wave shielding material.

In this way, an electromagnetic wave shielding material, which was composed of five layers of a magnetic layer, a pressure-sensitive adhesive layer, a PET film (resin layer), a pressure-sensitive adhesive layer, and a magnetic layer, where these five layers were included in this order, was obtained. As a result of subjecting the obtained electromagnetic wave shielding material to the evaluation of formability described above, the same evaluation results as in Example 1 were obtained.

One aspect of the present invention is useful in the technical fields of various electronic components and various electronic apparatuses.

What is claimed is:

1. An electromagnetic wave shielding material comprising:
   one or more magnetic layers containing magnetic particles and a resin, where a content of the resin in the magnetic layer is 5% by mass or more and less than 40% by mass; and
   one or more pressure-sensitive adhesive layers,
   wherein an elongation rate determined by a tensile test at 150° C. is 5.0% or more and less than 150.0%, and
   a storage elastic modulus E' in a dynamic viscoelasticity measurement at 1 Hz is 0.010 GPa or more and less than 10.000 GPa at 60° C.

2. The electromagnetic wave shielding material according to claim 1,
   wherein the magnetic layer contains a resin having a urethane structure.

3. The electromagnetic wave shielding material according to claim 1, further comprising:
   a resin layer that is located between two layers of the pressure-sensitive adhesive layers.

4. The electromagnetic wave shielding material according to claim 3,
   wherein a thickness of the resin layer is less than 10 μm.

5. The electromagnetic wave shielding material according to claim 1, further comprising:
   two or more metal layers,
   wherein the electromagnetic wave shielding material includes one or more layers of the magnetic layers, the one or more layers being sandwiched between two layers of the metal layer.

6. The electromagnetic wave shielding material according to claim 1,
   wherein the magnetic layer contains flat-shaped metal particles as the magnetic particles.

7. The electromagnetic wave shielding material according to claim 1,
   wherein the electromagnetic wave shielding material has a sheet shape.

8. The electromagnetic wave shielding material according to claim 1,
   wherein
   the magnetic layer contains a resin having a urethane structure,
   the electromagnetic wave shielding material further has a resin layer located between two layers of the pressure-sensitive adhesive layers,
   a thickness of the resin layer is less than 10 μm,
   the electromagnetic wave shielding material further has two or more metal layers and includes one or more layers of the magnetic layers, the one or more layers being sandwiched between two layers of the metal layer,
   the magnetic layer contains flat-shaped metal particles as the magnetic particles, and
   the electromagnetic wave shielding material has a sheet shape.

9. An electronic component comprising:
   the electromagnetic wave shielding material according to claim 1.

10. An electronic apparatus comprising:
the electromagnetic wave shielding material according to claim 1.

11. An electromagnetic wave shielding material comprising:
one or more magnetic layers containing magnetic particles and a resin, where a content of the resin in the magnetic layer is 5% by mass or more and less than 40% by mass; and
one or more pressure-sensitive adhesive layers,
wherein an elongation rate determined by a tensile test at 150° C. is 5.0% or more and less than 150.0%, and
the electromagnetic wave shielding material further comprises:
a resin layer that is located between two layers of the pressure-sensitive adhesive layers.

12. The electromagnetic wave shielding material according to claim 11,
wherein a thickness of the resin layer is less than 10 μm.

13. An electronic component comprising:
the electromagnetic wave shielding material according to claim 12.

14. An electronic apparatus comprising:
the electromagnetic wave shielding material according to claim 12.

15. An electronic component comprising:
the electromagnetic wave shielding material according to claim 11.

16. An electronic apparatus comprising:
the electromagnetic wave shielding material according to claim 11.

17. An electromagnetic wave shielding material comprising:
one or more magnetic layers containing magnetic particles and a resin, where a content of the resin in the magnetic layer is 5% by mass or more and less than 40% by mass; and
one or more pressure-sensitive adhesive layers,
wherein an elongation rate determined by a tensile test at 150° C. is 5.0% or more and less than 150.0%, and
the electromagnetic wave shielding material further comprises:
two or more metal layers,
wherein the electromagnetic wave shielding material includes one or more layers of the magnetic layers, the one or more layers being sandwiched between two layers of the metal layer.

18. An electronic component comprising:
the electromagnetic wave shielding material according to claim 17.

19. An electronic apparatus comprising:
the electromagnetic wave shielding material according to claim 17.

* * * * *